US012733329B2

(12) United States Patent
Chen et al.

(10) Patent No.: US 12,733,329 B2
(45) Date of Patent: Sep. 8, 2026

(54) PEROVSKITE SOLAR CELL AND PHOTOVOLTAIC MODULE

(71) Applicant: CONTEMPORARY AMPEREX TECHNOLOGY (HONG KONG) LIMITED, Ningde (CN)

(72) Inventors: Changsong Chen, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 148 days.

(21) Appl. No.: 18/734,442

(22) Filed: Jun. 5, 2024

(65) Prior Publication Data

US 2024/0324253 A1 Sep. 26, 2024

Related U.S. Application Data

(63) Continuation of application No. PCT/CN2022/128778, filed on Oct. 31, 2022.

(30) Foreign Application Priority Data

Dec. 8, 2021 (CN) ......................... 202111494365.0

(51) Int. Cl.
*H10K 30/40* (2023.01)
*H10K 85/50* (2023.01)
(Continued)

(52) U.S. Cl.
CPC ............ *H10K 30/40* (2023.02); *H10K 85/50* (2023.02); *H10K 2101/30* (2023.02); *H10K 2101/40* (2023.02)

(58) Field of Classification Search
None
See application file for complete search history.

(56) References Cited

U.S. PATENT DOCUMENTS

2008/0121264 A1 5/2008 Chen et al.
2017/0133163 A1 5/2017 Russell et al.
(Continued)

FOREIGN PATENT DOCUMENTS

CN 103855306 A 6/2014
CN 107112419 A 8/2017
(Continued)

OTHER PUBLICATIONS

State Intellectual Property Office of China Notice of the Granting of a Patent Right for Application No. 202111494365.0 Jun. 10, 2025 8 pages (including translation).

(Continued)

*Primary Examiner* — Eli S Mekhlin
(74) *Attorney, Agent, or Firm* — ANOVA LAW GROUP, PLLC

(57) ABSTRACT

A perovskite solar cell includes a perovskite layer comprising a first surface and a second surface that are opposite each other in the thickness direction thereof; a hole transport layer provided on the first surface; and an electron transport layer provided on the second surface. The electron transport layer comprises at least two sub-layers and a doping material, and each of the sub-layers has a conduction band bottom energy level lower than that of the hole transport layer and a valence band top energy level lower than that of the hole transport layer.

15 Claims, 1 Drawing Sheet

(51) Int. Cl.
*H10K 101/30* (2023.01)
*H10K 101/40* (2023.01)

(56) References Cited

U.S. PATENT DOCUMENTS

| | | | | |
|---|---|---|---|---|
| 2017/0194102 | A1* | 7/2017 | Huang | H01G 9/2013 |
| 2022/0231242 | A1* | 7/2022 | Yan | H10K 71/12 |

FOREIGN PATENT DOCUMENTS

| | | | |
|---|---|---|---|
| CN | 110098337 | A | 8/2019 |
| CN | 110190195 | A | 8/2019 |
| CN | 110400879 | A | 11/2019 |
| CN | 111668373 | A | 9/2020 |
| CN | 112349852 | A | 2/2021 |
| CN | 113517404 | A | 10/2021 |
| CN | 113571641 | A | 10/2021 |
| CN | 214848680 | U | 11/2021 |
| JP | H05210247 | A | 8/1993 |
| JP | 2012019155 | A | 1/2012 |
| JP | 2015228413 | A | 12/2015 |
| JP | 2017126677 | A | 7/2017 |
| JP | 2021040133 | A | 3/2021 |
| WO | 2019235461 | A1 | 12/2019 |
| WO | 2020105207 | A1 | 5/2020 |

OTHER PUBLICATIONS

The Korean Intellectual Property Office Request for the Submission of an Opinion for Application No. 10-2024-7018634 Jun. 24, 2025 15 Pages (including translation).

Yang Ying et al., Advances of Electron Transport Materials in Perovskite Solar Cells: Synthesis and Application, Progress In Chemistry, 2021, 281-302p, vol. 33, Issue 2.

The European Patent Office (EPO) The Extended European Search Report for Application No. 22903074.7, Mar. 10, 2025 11 Pages.

The Japan Patent Office (JPO) Reasons for Refusal for Application No. 2024-533056 Mar. 5, 2025 10 Pages (including translation).

Kong et al. ,Modification of the SnO, Electron Transporting Layer by Using Perylene Diimide Derivative for Efficient Organic Solar Cells, Frontiers in Chemistry, Jun. 25, 2021, vol. 9.

Liu et al. ,A cascade-type electron extraction design for efficient low-bandgap perovskite solar cells based on a conventional structure with suppressed open-circuit voltage loss, Materials Chemistry Frontiers, 2019, vol. 3, p. 496-504.

Mohamad Noh et al. , The architecture of the electron transport layer for a perovskite solar cell, Journal of Materials Chemistry, 2018, vol. 6, p. 682-712.

Dagar et al. ,Low-Temperature Solution-Processed Thin SnO2/Al2O3 Double Electron Transport Layers Toward 20% Efficient Perovskite Solar Cells, IEEE Journal of Photovoltaics, Sep. 2019, vol. 9, No. 5, p. 1390-1315.

The World Intellectual Property Organization (WIPO) International Search Report for PCT/CN2022/128778 Jan. 17, 2023 7 Pages (including translation).

Gong. Xiu et al. “Highly Efficient Perovskite Solar Cells with Gradient Bilayer Electron Transport Materials” Nano Letters, May 21, 2018 (May 21, 2018), ISSN: 1530-6992, pp. 3969-3976.

* cited by examiner

PEROVSKITE SOLAR CELL AND PHOTOVOLTAIC MODULE

CROSS-REFERENCE TO RELATED APPLICATION

The present application is a continuation of International Application No. PCT/CN2022/128778, filed on Oct. 31, 2022, which claims priority to Chinese Patent Application No. 202111494365.0, entitled "PEROVSKITE SOLAR CELL AND PHOTOVOLTAIC MODULE" and filed on Dec. 8, 2021, the entire contents of which are incorporated herein by reference.

TECHNICAL FIELD

The present application relates to the technical field of solar cells, in particular to a perovskite solar cell and a photovoltaic module.

BACKGROUND ART

Perovskite solar cells are solar cells with an organic metal halide perovskite material as a light absorption layer, which have excellent photovoltaic properties and can be prepared by simple methods, bringing new space and hope to photovoltaic power generation.

In the production process of perovskite solar cells, how to further improve the photoelectric conversion efficiency thereof is an urgent problem to be solved.

SUMMARY

The embodiments of the present application provide a perovskite solar cell and a photovoltaic module, and the photoelectric conversion efficiency of the perovskite solar cell can be improved.

An embodiment of the first aspect of the present application provides a perovskite solar cell comprising a perovskite layer, a hole transport layer and an electron transport layer, wherein the perovskite layer comprises a first surface and a second surface that are opposite each other in the thickness direction thereof; the hole transport layer is provided on the first surface; and the electron transport layer is provided on the second surface, the electron transport layer comprises at least two sub-layers and a doping material, and each of the sub-layers has a conduction band bottom energy level lower than that of the hole transport layer and a valence band top energy level lower than that of the hole transport layer.

A second aspect of the present application provides a photovoltaic module, comprising a perovskite solar cell according to any embodiment of the first aspect of the present application.

BRIEF DESCRIPTION OF THE DRAWINGS

To more clearly illustrate the technical solutions of the embodiments of the present application, the accompanying drawings required in the embodiments of the present application will be briefly described below. Obviously, the accompanying drawings described below are merely some embodiments of the present application, and for those of ordinary skill in the art, other accompanying drawings can be obtained from these accompanying drawings without making creative efforts.

Figure 1:
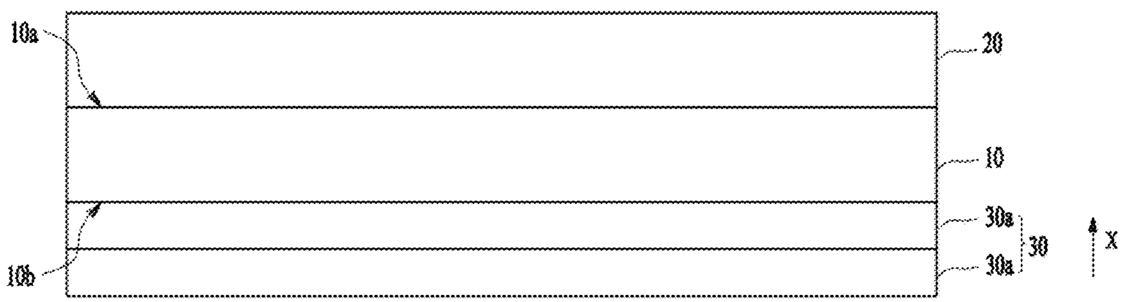
FIG. 1 shows the structural schematic diagram of a perovskite solar cell provided by some embodiments of the present application.

In the drawings, the figures are not necessarily drawn to scale.

Reference signs in the drawings are as follows:

X, thickness direction;

10, perovskite layer; **10*a*, first surface; 10*b***, second surface;

20, hole transport layer;

30, electron transport layer; 31, first sub-layer; 32, second sub-layer; 33, third sub-layer;

40, first electrode; 50, second electrode.

DETAILED DESCRIPTION OF EMBODIMENTS

Hereinafter, embodiments of the perovskite solar cell and the photovoltaic module of the present application are disclosed in detail appropriately with reference to the detailed description of the drawings. However, unnecessary detailed illustrations may be omitted in some instances. For example, there are situations where detailed description of well-known items and repeated description of actually identical structures are omitted. This is to prevent the following description from being unnecessarily verbose, and facilitates understanding by those skilled in the art. Moreover, the accompanying drawings and the descriptions below are provided for enabling those skilled in the art to fully understand the present application, rather than limiting the subject matter disclosed in the claims.

The "ranges" disclosed in the present application are defined in the form of lower and upper limits. A given range is defined by selecting a lower limit and an upper limit, and the selected lower and upper limits defining the boundaries of the particular range. Ranges defined in this manner may be inclusive or exclusive, and may be arbitrarily combined, that is, any lower limit may be combined with any upper limit to form a range. For example, if the ranges 60-120 and 80-110 are listed for a particular parameter, it should be understood that the ranges 60-110 and 80-120 are also contemplated. Additionally, if minimum range values 1 and 2 are listed and maximum range values 3, 4, and 5 are listed, the following ranges are all contemplated: 1-3, 1-4, 1-5, 2-3, 2-4, and 2-5. In the present application, unless stated otherwise, the numerical range "a-b" denotes an abbreviated representation of any combination of real numbers between a and b, where both a and b are real numbers. For example, the numerical range "0-5" means that all the real numbers between "0-5" have been listed herein, and "0-5" is just an abbreviated representation of combinations of these numerical values. In addition, when a parameter is expressed as an integer≥2, it is equivalent to disclosing that the parameter is, for example, an integer of 2, 3, 4, 5, 6, 7, 8, 9, 10, 11, 12, etc.

All the embodiments and optional embodiments of the present application can be combined with one another to form new technical solutions, unless otherwise stated.

All the technical features and optional technical features of the present application can be combined with one another to form a new technical solution, unless otherwise stated.

Unless otherwise stated, all the steps of the present application may be performed sequentially or randomly, in some embodiments sequentially. For example, the method including steps (a) and (b) indicates that the method may comprise steps (a) and (b) carried out sequentially, and may also comprise steps (b) and (a) carried out sequentially. For example, reference to "the method may further comprise step (c)" indicates that step (c) may be added to the method in any order, e.g., the method may comprise steps (a), (b) and (c), steps (a), (c) and (b), or steps (c), (a) and (b).

The terms "comprise" and "include" mentioned in the present application are open-ended or may also be closed-ended, unless otherwise stated. For example, "comprise" and "include" may mean that other components not listed may or may not further be comprised or included.

In the present application, the term "or" is inclusive unless otherwise specified. For example, the phrase "A or B" means "A, B, or both A and B". More specifically, the condition "A or B" is satisfied by any one of the following: A is true (or present) and B is false (or not present); A is false (or not present) and B is true (or present); or both A and B are true (or present). In this disclosure, the phrases "at least one of A, B, and C" and "at least one of A, B, or C" both mean only A, only B, only C, or any combination of A, B, and C.

A perovskite solar cell comprises a perovskite layer, a hole transport layer, an electron transport layer, and an electrode. The working process of a perovskite cell mainly includes: generation and separation of excitons, transport of free carriers, collection of carriers, and generation of current. The specific process is as follows: the perovskite layer in a perovskite solar cell absorbs photons from sunlight to generate excitons. Since the perovskite layer has low coulomb force binding, excitons are then separated into free electrons and holes. The separated free carriers are transported in the perovskite layer and transported through transport layers. The electron transport layer plays a role in transporting electrons and blocking holes, while the hole transport layer plays a role in transporting holes and blocking electrons. The electrons and holes transported through the transport layers are respectively collected by electrodes to form current and voltage.

In addition, in the working process of a perovskite cell, carrier recombination will occur at the interface between the perovskite layer and the transport layers, which will seriously affect the efficiency of perovskite solar cells.

In order to improve the photoelectric conversion efficiency of perovskite solar cells, the inventors improve a perovskite solar cell by adjusting and controlling the energy level structure by means of bulk doping. Adjusting and controlling the energy level structure can reduce the recombination of photon-generated carriers to a certain extent and improve the extraction and transport efficiency of electrons, thereby increasing the open circuit voltage and current.

[Perovskite Solar Cell]

An embodiment of the first aspect of the present application provides a perovskite solar cell.

FIG. 1 shows the structural schematic diagram of a perovskite solar cell provided by some embodiments of the present application. As shown in FIG. 1, the perovskite solar cell comprises a perovskite layer 10, a hole transport layer 20, and an electron transport layer 30. The perovskite layer 10 comprises a first surface 10*a* and a second surface 10*b* that are opposite each other in the thickness direction X thereof. The hole transport layer 20 is provided on the first surface 10*a*. The electron transport layer 30 is provided on the second surface 10*b*, the electron transport layer 30 comprises at least two sub-layers 30*a* and the electron transport layer 30 comprises a doping material, wherein each of the sub-layers 30*a* has a conduction band bottom energy level lower than that of the hole transport layer 20, and each of the sub-layers 30*a* has a conduction band bottom energy level lower than the valence band top energy level of the hole transport layer 20.

The energy level structure of the perovskite solar cell according to an embodiment of the present application is adjusted and controlled by doping the electron transport layer 30 with a doping material, such that the conduction band bottom energy level of each of the sub-layers 30*a* in the electron transport layer 30 is lower than that of the hole transport layer 20, the valence band top energy level of each of the sub-layers 30*a* is lower than that of the hole transport layer 20, and there is a difference between the energy levels of each of the sub-layers 30*a* and the hole transport layer 20. The presence of such a difference between the energy levels can ensure the formation of a built-in electric field in the perovskite solar cell and the efficient transport of carriers. Meanwhile, the difference between the conduction band bottom energy levels can ensure the unidirectional transport of electrons, and the difference between the valence band top energy levels can ensure the unidirectional transport of holes, which can effectively improve the photoelectric conversion efficiency of the perovskite solar cell. In addition, according to an embodiment of the present application, the migration of halogens in the perovskite layer 10 can be inhibited, which improves the structural stability of the perovskite solar cell.

A larger difference between the energy levels of each of the sub-layers 30*a* and the hole transport layer 20 can further ensure the formation of a built-in electric field in the perovskite solar cell and the efficient transport of carriers.

In some embodiments, the difference between the conduction band bottom energy levels of the sub-layer 30*a* of the electron transport layer 30 that is close to the second surface 10*b* and the perovskite layer 10 is −1.0 eV-1.0 eV. Optionally, the difference between the conduction band bottom energy levels of the sub-layer 30*a* of the electron transport layer 30 that is close to the second surface 10*b* and the perovskite layer 10 is −0.3 eV-0.3 eV. With the difference between the energy levels of the sub-layer 30*a* of the electron transport layer 30 that is close to the second surface 10*b* and the perovskite layer 10 satisfying the numerical range above, the electron transport efficiency can be improved. Moreover, with the difference between the conduction band bottom energy levels in the range above, the recombination of photon-generated carriers can be reduced, thereby increasing the open circuit voltage and current.

In some embodiments, the valence band top energy level of the sub-layer 30*a* of the electron transport layer 30 that is close to the second surface 10*b* is lower than that of the perovskite layer 10. The valence band top energy level of the sub-layer 30*a* of the electron transport layer 30 that is close to the second surface 10*b* can more effectively block the holes from the perovskite layer 10, which can avoid the recombination of a hole and an electron to a certain extent to reduce the current of the perovskite solar cell.

In some embodiments, the difference between the Fermi levels of the sub-layer 30*a* of the electron transport layer 30 that is close to the second surface 10*b* and the perovskite layer is 10≤1.5 eV, and with the difference in the above range, it can be ensured that the electron transport layer 30 is electron-conductive, thereby improving the electron transport efficiency.

Barriers may be formed on transport channels for carriers due to severe band bending, which affects the performance of perovskite solar cells. In some embodiments, the difference between the conduction band bottom energy level and the Fermi level of the sub-layer 30*a* of the electron transport layer 30 that is close to the second surface 10*b* is ≤1.5 eV, and with the difference in the range above, unnecessary band bending between the electron transport layer 30 and the perovskite layer 10 can be reduced, which improves the transport efficiency of carriers, thereby improving the photoelectric conversion efficiency of the perovskite solar cell.

In some embodiments, the difference between the conduction band bottom energy level and the valence band top energy level of the sub-layer 30*a* of the electron transport layer 30 that is close to the second surface 10*b* is ≥1.5 eV, and the sub-layer satisfying the above numerical range has a larger band gap, which can filter ultraviolet light, thereby avoiding the damage of ultraviolet light to the perovskite layer 10.

[Electron Transport Layer]

As a transport layer, the electron transport layer 30 can effectively transport electrons and reduce the carrier recombination at the interface between the perovskite layer 10 and the electron transport layer 30, thereby improving the photoelectric conversion efficiency of the perovskite solar cell.

In an embodiment of the present application, the electron transport layer 30 comprises at least two sub-layers 30*a*.

As an example, the electron transport layer 30 comprises two sub-layers 30*a*, namely a first sub-layer 31 and a second sub-layer 32, respectively; or the electron transport layer 30 comprises three sub-layers 30*a*, namely a first sub-layer 31, a second sub-layer 32, and a third sub-layer 33, respectively; or the electron transport layer 30 comprises four sub-layers, namely a first sub-layer 31, a second sub-layer 32, a third sub-layer 33, and a fourth sub-layer, respectively, and so forth. The above description of electron transport layer 30 is only for illustrative purposes and is not intended to limit the specific number of layers of the electron transport layer 30.

Figure 2:
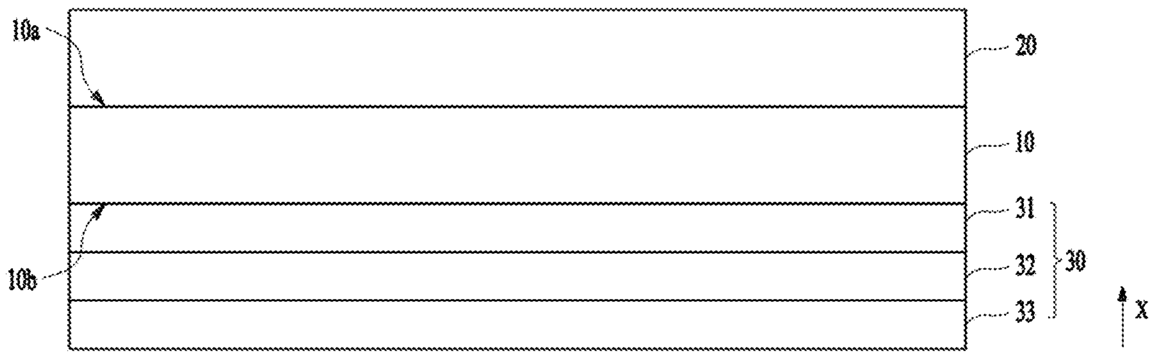
FIG. 2 shows the structural schematic diagram of a perovskite solar cell provided by some other embodiments of the present application.

FIG. 2 shows the structural schematic diagram of a perovskite solar cell provided by some embodiments of the present application. As shown in FIG. 2, in some embodiments, the electron transport layer 30 comprises three sub-layers, namely a first sub-layer 31, a second sub-layer 32, and a third sub-layer 33, respectively. The first sub-layer 31, the second sub-layer 32, and the third sub-layer 33 are stacked sequentially in the direction away from the second surface 10*b*. The first sub-layer 31 is provided close to the perovskite layer 10, the third sub-layer 33 is provided away from the perovskite layer 10, and the second sub-layer 32 is provided between the first sub-layer 31 and the third sub-layer 33. The electron transport layer 30 comprising three sub-layers enables the flexible adjustment and control of the energy level of each layer, which is conducive to improving the extraction efficiency and transport efficiency of carriers.

The first sub-layer 31 is a tin oxide layer comprising a first doping material. The first doping material comprises an alkali metal, an alkaline earth metal, a transition metal, a poor metal, a metalloid, a non-metallic element, an ionic liquid, a carboxylic acid, a phosphoric acid, a carbon derivative, a self-assembled single molecule or an organic polymer. The tin oxide layer has not only good energy level alignment but also high mobility itself, enabling efficient electron extraction and transport. By doping the first sub-layer 31 with a first doping material, the first doping material can adjust and control the energy levels of the first sub-layer 31 and passivate the bulk phase defects of the material, which can increase the concentration and mobility of carriers, thereby improving the photoelectric conversion efficiency of the perovskite solar cell.

By selecting the first doping material, the energy levels of the electron transport layer 30 can be effectively improved, and the energy level structure of the perovskite cell can be adjusted. Next, the first doping material is illustrated with specific examples.

As some examples of the alkali metal, the alkali metal includes at least one of Li, K, Na, Rb and Cs.

As some examples of the alkaline earth metal, the alkaline earth metal includes at least one of Be, Sr and Ba.

As some examples of the transition metal, the transition metal includes at least one of Ti, Cr, Mn, Fe, Co, Ni, Cu, Zn, Zr, Nb, Mo, Ru, Rh, Pd, Ag, Cd, Ta, Pt and Au.

As some examples of the poor metal, the poor metal includes at least one of Al, Ga, In, Sn, Tl, Pb and Bi.

As some examples of the metalloid, the metalloid includes at least one of B, Si, Ge, As, Sb and Te.

As some examples of the non-metallic element, the non-metallic element includes at least one of F, Cl, Br, I, P, S and Se.

As some examples of the ionic liquid, the ionic liquid includes at least one of 1-butyl-3-methylimidazolium tetrafluoroborate, ammonium chloride, ammonium sulfide, tetramethylammonium hydroxide and 2,2,2-trifluoroethanol.

As some examples of the carboxylic acid, the carboxylic acid includes at least one of ethylenediaminetetraacetic acid, diethylenetriaminepentaacetic acid, 4-imidazoleacetic acid hydrochloride, and acetic acid.

As some examples of the carbon derivative, the carbon derivative includes at least one of carbon quantum dots, carbon nanotubes, graphene, carbon 60, carbon 60 derivatives, graphitic carbon nitride and carbon 9.

As some examples of the self-assembled single molecule, the self-assembled single molecule includes at least one of 4-pyridinecarboxylic acid, dopamine, 3-aminopropyltriethoxysilane and glycine.

As some examples of the organic polymer, the organic polymer includes at least one of polystyrene, polyethylenimine ethoxylated, polyethylene oxide, and triphenylphosphine oxide.

The second sub-layer 32 includes an imide compound layer, a quinone compound layer, a fullerene layer, a perovskite oxide layer, a fluoride layer, or an oxide layer. The first sub-layer 31 and the second sub-layer 32 synergize with each other, which can effectively improve the energy level structure of the electron transport layer 30.

As some examples of the imide compound layer, the imide compound layer comprises an imide compound or a derivative of the imide compound, and the imide compound includes phthalamide, succinimide, N-bromosuccinimide, glutarimide or maleimide.

As some examples of the quinone compound layer, the quinone compound layer comprises a quinone compound or a derivative of the quinone compound, and the quinone compound includes benzoquinone, naphthoquinone, phenanthrenequinone or anthraquinone.

As some examples of the perovskite oxide layer, the perovskite oxide layer comprises strontium titanate, calcium titanate, barium titanate, lithium titanate, iron(II) titanium oxide, nickel titanate or cobalt titanate.

As some examples of the fluoride layer, the fluoride layer comprises lithium fluoride or calcium fluoride.

As some examples of the oxide layer, the oxide layer comprises an oxide layer of the following elements: Ce, Mg, Si, Cd, Zn, In, Pb, Mo, W, Sb, Bi, Cu, Hg, Ti, Ag, Mn, Fe, V, Sn, Zr, Sr, Ga or Cr.

The third sub-layer 33 comprises a metal oxide layer or a metal oxide layer comprising a second doping material, and the metal oxide layer includes a $SnO_2$ layer, a $In_2O_3$ layer, a ZnO layer, a CdO layer, a NiO layer, a $CdIn_2O_4$ layer, a $Cd_2SnO_4$ layer, a $Zn_2SnO_4$ layer, a $MgIn_2O_4$ layer, a $ZnIn_2O_4$ layer, a $CoIn_3O_6$ layer, a $ZnV_2O_6$ layer, a $CuAlO_2$ layer, or a $CuGaO_2$ layer. The first sub-layer 31, the second sub-layer 32, and the third sub-layer 33 synergize with each other, which can effectively improve the energy level structure of the electron transport layer 30.

As some examples of the $SnO_2$ layer, the $SnO_2$ layer comprises a second doping material, the element of which comprises at least one of F, Sb, P, As, Te and Cl.

As some examples of the $In_2O_3$ layer, the $In_2O_3$ layer comprises a second doping material, the element of which comprises at least one of W, Mn, Zr, Ti, Sb, F and Ag.

As some examples of the ZnO layer, the ZnO layer comprises a second doping material, the element of which comprises at least one of Ga, In, F, N, B and Al.

[Hole Transport Layer]

As a transport layer, the hole transport layer 20 can effectively transport holes and reduce the carrier recombination at the interface between the perovskite layer 10 and the hole transport layer 20, thereby improving the photoelectric conversion efficiency of the perovskite solar cell. The material of the hole transport layer 20 can be selected from conventional material in the art, which is not limited herein.

[Perovskite Layer]

As an absorbing layer of light, the perovskite layer 10 can convert photons into holes and electrons and the material thereof can be selected from conventional material in the art, which is not limited herein.

The perovskite solar cell according to an embodiment of the present application further comprises a first electrode and a second electrode. At least one of the first electrode and the second electrodes is a transparent electrode. As an example, the transparent electrode is an FTO conductive glass electrode.

Figure 3:
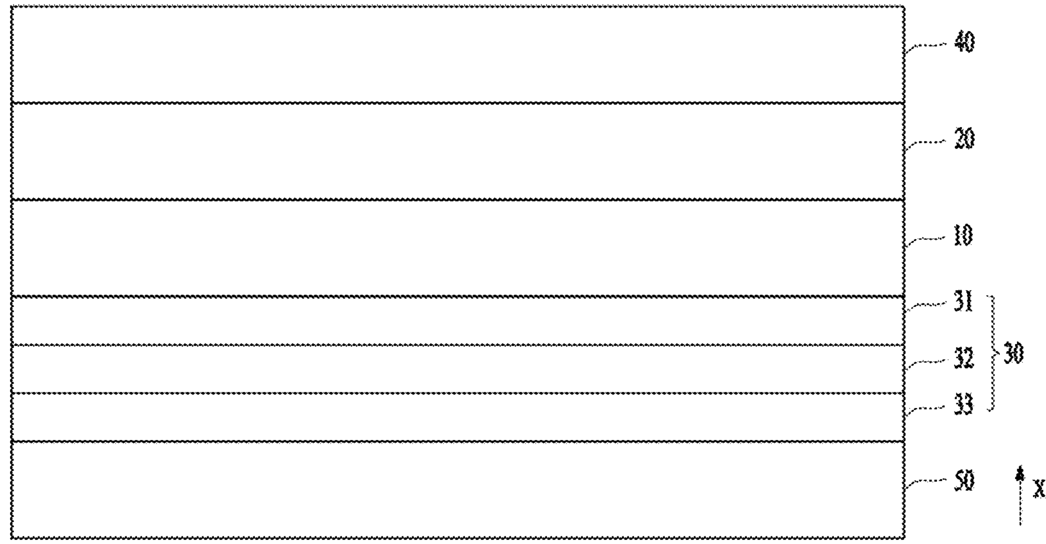
FIG. 3 shows the structural schematic diagram of a perovskite solar cell provided by yet further embodiments of the present application.

FIG. 3 shows the structural schematic diagram of a perovskite solar cell provided by some embodiments of the present application. As shown in FIG. 3, the perovskite solar cell comprises a first electrode 40, a hole transport layer 20, a perovskite layer 10, an electron transport layer 30 and a second electrode 50, which are stacked sequentially in the thickness direction X thereof, wherein the electron transport layer 30 comprises a first sub-layer 31, a second sub-layer 32, and a third sub-layer 33.

[Method for Preparing Perovskite Solar Cell]

A second aspect of the present application provides a method for preparing a perovskite solar cell, which is used to prepare the perovskite solar cell of the first aspect of the present application, with each of the sub-layers of the electron transport layer of the prepared perovskite solar cell having a conduction band bottom energy level lower than that of the hole transport layer and a valence band top energy level lower than that of the hole transport layer.

[Photovoltaic Module]

A third aspect of the present application further provides a photovoltaic module, comprising a perovskite solar cell according to any embodiment of the first aspect of the present application, or a perovskite solar cell prepared by the method according to the second aspect of the present application. The perovskite solar cell can be used as a power supply for the photovoltaic module, or can also be used as an energy storage unit for the photovoltaic module.

EXAMPLES

The present application will be described in more detail by the following examples, which are used only for explanatory illustration, since various modifications and changes within the scope of the present application are obvious to those skilled in the art. Unless otherwise noted, all parts, percentages and ratios reported in the following examples are on a weight basis, and all reagents used in the examples are commercially available or are synthesized according to conventional methods, and can be used directly without further treatment, and the instruments used in the examples are commercially available.

Examples 1-21

Preparation of FTO Conductive Glass Electrode

A set of FTO conductive glasses with a size of 2.0 cm×2.0 cm were used, with the surface thereof being washed twice with acetone and isopropanol sequentially, and were immersed in deionized water for an ultrasonic treatment for 10 min, then dried in a blast drying oven and placed in a glove box (under N2 atmosphere).

Preparation of Electron Transport Layer Comprising a First Sub-Layer and a Second Sub-Layer.

Preparation of Second Sub-Layer

A second doping material was added to a second host material to form a second mixture.

The second mixture was spin-coated onto the FTO conductive glass electrode at a speed of 4000 rpm-6500 rpm and was heated at a constant temperature on a constant-temperature heating platform, with the coating thickness being 10-30 nm.

Preparation of First Sub-Layer

A first doping material was added to a first host material to form a first mixture.

The first mixture was spin-coated onto the second sub-layer at a speed of 4000 rpm-6500 rpm and was heated at a constant temperature on a constant-temperature heating platform, with the coating thickness being 10-30 nm.

Preparation of Perovskite Layer

The resulting first sub-layer was spin-coated with a 1.5 mol/L M solution at a speed of 3000 rpm-4500 rpm, and then the resulting product was transferred onto a constant-temperature heating platform, heated at 100° C. for 30 min and cooled to room temperature, so as to form a perovskite layer with a thickness of 500 nm.

Preparation of Hole Transport Layer

The perovskite layer was further spin-coated with a 0.1 mol/L solution of copper oxide in ethyl acetate at a speed of 4500 rpm-6000 rpm and was heated at 100° C. for 60 min, with the thickness being 30-60 nm.

Preparation of Ag Electrode

The above-mentioned sample was put into a vacuum coating machine, and an Ag electrode was evaporated onto the surface of the resulting hole transport layer under a vacuum condition of $5\times10^{-4}$ Pa, with the thickness of the Ag electrode being 80 nm.

The types of relevant substances in examples 1 to 21 were shown in Table 1:

TABLE 1

| | Second sub-layer | | | First sub-layer | | | M solution for perovskite layer | | |
|---|---|---|---|---|---|---|---|---|---|
| | Second host material | Second doping material | Heating temperature and time | First host material | First doping material | Heating temperature and time | Solute | Solvent | Hole transport layer |
| Example 1 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of KCl | 150° C., 15 min | $FAMAPbI_3$ | DMF | Solution of copper oxide in ethyl acetate |
| Example 2 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of RbCl | 150° C., 15 min | $MAPbI_3$ | DMF | Solution of copper oxide in ethyl acetate |
| Example 3 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of NaCl | 150° C., 15 min | $MAPbI_3$ | DMF | Solution of copper oxide in ethyl acetate |
| Example 4 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of CsCl | 150° C., 15 min | $MAPbI_3$ | DMF | Solution of copper oxide in ethyl acetate |
| Example 5 | 0.15 mL of 2 wt. % aqueous solution of ZnO nano-colloid | 0.01 mL of 3 mg/mL aqueous solution of KCl | 400° C., 12 min | 0.15 mL of 3 wt. % aqueous solution of $SnO_2$ nano-colloid | None | 150° C., 15 min | $MAPbI_3$ | DMF | Solution of cuprous oxide in ethyl acetate |
| Example 6 | 0.15 mL of 2 wt. % aqueous solution of ZnO nano-colloid | 0.01 mL of 3 mg/mL aqueous solution of RbCl | 400° C., 12 min | 0.15 mL of 3 wt. % aqueous solution of $SnO_2$ nano-colloid | None | 150° C., 15 min | $MAPbI_3$ | DMF | Solution of cuprous oxide in ethyl acetate |
| Example 7 | 0.15 mL of 2 wt. % aqueous solution of ZnO nano-colloid | 0.01 mL of 3 mg/mL aqueous solution of NaCl | 400° C., 12 min | 0.15 mL of 3 wt. % aqueous solution of $SnO_2$ nano-colloid | None | 150° C., 15 min | $MAPbI_3$ | DMF | Solution of cuprous oxide in ethyl acetate |
| Example 8 | 0.15 mL of 2 wt. % aqueous solution of ZnO nano-colloid | 0.01 mL of 3 mg/mL aqueous solution of CsCl | 400° C., 12 min | 0.15 mL of 3 wt. % aqueous solution of $SnO_2$ nano-colloid | None | 150° C., 15 min | $MAPbI_3$ | DMF | Solution of cuprous oxide in ethyl acetate |
| Example 9 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of KCl | 150° C., 15 min | $MAPbI_2Br$ | DMF | Solution of copper oxide in ethyl acetate |
| Example 10 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of KCl | 150° C., 15 min | $FAPbI_3$ | DMF | Solution of copper oxide in ethyl acetate |
| Example 11 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of CsCl | 150° C., 15 min | $FA_{0.85}Cs_{0.15}PbI_3$ | DMF | Solution of copper oxide in ethyl acetate |

TABLE 1-continued

| | Second sub-layer | | | First sub-layer | | | M solution for perovskite layer | | |
|---|---|---|---|---|---|---|---|---|---|
| | Second host material | Second doping material | Heating temperature and time | First host material | First doping material | Heating temperature and time | Solute | Solvent | Hole transport layer |
| Example 12 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of RbCl | 150° C., 15 min | $FA_{0.9}Cs_{0.1}PbI_3$ | DMF | Solution of copper oxide in ethyl acetate |
| Example 13 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of LiF | 150° C., 15 min | $FA_{0.9}MA_{0.1}PbI_3$ | DMF | Solution of copper oxide in ethyl acetate |
| Example 14 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of KCl | 150° C., 15 min | $MAPbBr_3$ | DMF | Solution of copper oxide in ethyl acetate |
| Example 15 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL LiF and 0.01 mL of 3 mg/mL $CoCl_2$ | 150° C., 15 min | $FAPbI_3$ | DMF | Solution of copper oxide in ethyl acetate |
| Example 16 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL aqueous solution of LiF | 150° C., 15 min | $FAPbI_3$ | DMF | Solution of copper oxide in ethyl acetate |
| Example 17 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL CsI and 0.01 mL of 3 mg/mL $CoCl_2$ | 150° C., 15 min | $FAPbI_3$ | DMF | Solution of copper oxide in ethyl acetate |
| Example 18 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL LiF and 0.01 mL of 3 mg/mL $CoCl_2$ | 150° C., 15 min | $FAPbI_3$ | DMF | Solution of copper oxide in ethyl acetate |
| Example 19 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL LiF and 0.01 mL of 3 mg/mL $Ni(NO_3)_2$ | 150° C., 15 min | $FAPbI_3$ | DMF | Solution of copper oxide in ethyl acetate |
| Example 20 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL LiF and 0.01 mL of 3 mg/mL $CrCl_2$ | 150° C., 15 min | $FAPbI_3$ | DMF | Solution of copper oxide in ethyl acetate |
| Example 21 | 0.15 ml of 1.0 mol/L aqueous solution of perylene diimide | None | 100° C., 10 min | 0.15 mL of 3 wt. % aqueous solution of $SnO_2$ nano-colloid | 0.01 mL of 3 mg/mL CsI and 0.01 mL of 3 mg/mL $FeCl_2$ | 150° C., 15 min | $FAPbI_3$ | DMF | Solution of copper oxide in ethyl acetate |

In Table 1, the aqueous solution of $SnO_2$ nano-colloid refers to $SnO_2$ particles with a particle size of 10-50 nm distributed in water. perylene diimide, i.e., perylene tetracarboxylic acid diimide, can be abbreviated as PDI. $FAMAPbI_3$ is formamidinium-methylammonium lead iodide perovskite. $MAPbI_3$ is methylammonium lead iodide perovskite. $MAPbI_2Br$ is methylammonium lead iodine bromide perovskite. $FA_{0.85}Cs_{0.15}PbI_3$ is formamidinium cesium-based lead iodide perovskite. $FA_{0.9}Cs_{0.1}PbI_3$ is formamidinium cesium-based lead iodide perovskite. $FA_{0.9}MA_{0.1}PbI_3$ is formamidinium-methylammonium lead iodide perovskite. $MAPbBr_3$ is methylammonium lead bromide perovskite. DMF refers to N,N-dimethylformamide.

Examples 22-40

Preparation of FTO Conductive Glass Electrode

A set of FTO conductive glasses with a size of 2.0 cm×2.0 cm were used, with the surface thereof being washed twice with acetone and isopropanol sequentially, and were immersed in deionized water for an ultrasonic treatment for 10 min, then dried in a blast drying oven and placed in a glove box (under $N_2$ atmosphere).

Preparation of Electron Transport Layer Comprising a First Sub-Layer, a Second Sub-Layer and a Third Sub-Layer

Preparation of Third Sub-Layer

A third doping material was doped into a third host material to form a third mixture.

The third mixture (target) was deposited onto the FTO conductive glass electrode by means of magnetron sputtering, with a sputtering power of 1000 W, an argon/oxygen ratio of 1:1, a pressure of 0.25 Pa and a sputtering thickness of 10-30 nm, followed by heating at 150° C. for 20 min.

Preparation of Second Sub-Layer

A second doping material was added to a second host material to form a second mixture.

The second mixture was spin-coated onto the FTO conductive glass electrode at a speed of 4000 rpm-6500 rpm and was heated at a constant temperature on a constant-temperature heating platform, with the coating thickness being 10-30 nm.

Preparation of First Sub-Layer

A first doping material was added to a first host material to form a first mixture.

The first mixture was spin-coated onto the second sub-layer at a speed of 4000 rpm-6500 rpm and was heated at a constant temperature on a constant-temperature heating platform, with the coating thickness being 10-30 nm.

Preparation of Perovskite Layer

The resulting electron transport layer was spin-coated with a 1.5 mol/L solution of $FA_{0.9}MA_{0.1}PbI_3$ in DMF at a speed of 3000 rpm-4500 rpm, then transferred onto a constant-temperature heating platform, heated at 100° C. for 30 min and cooled to room temperature to form a perovskite layer with a thickness of 500 nm.

Preparation of Hole Transport Layer

The perovskite layer was further spin-coated with a 0.1 mol/L solution of copper oxide in ethyl acetate at a speed of 4500 rpm-6000 rpm and was heated at 100° C. for 60 min, with the thickness being 30-60 nm.

Preparation of Ag Electrode

The above-mentioned sample was put into a vacuum coating machine, and an Ag electrode was evaporated onto the surface of the resulting hole transport layer under a vacuum condition of $5\times10^{-4}$ Pa, with the thickness of the Ag electrode being 80 nm.

The types of relevant substances in examples 22 to 40 were shown in Table 2:

TABLE 2

| | First sub-layer | | Second sub-layer | | Third sub-layer | | M solution for perovskite layer | | |
|---|---|---|---|---|---|---|---|---|---|
| | First host material | First doping material | Second host material | Second doping material | Third host material | Third doping material | Solute | Solvent | Hole transport layer |
| Example 22 | 0.15 mL of 3 wt. % aqueous solution of $SnO_2$ nano-colloid | 0.01 mL of 3 mg/mL aqueous solution of NaCl | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |
| Example 23 | 0.15 mL of 3 wt. % aqueous solution of $SnO_2$ nano-colloid | 0.01 mL of 3 mg/mL aqueous solution of $BeCl_2$ | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |
| Example 24 | 0.15 mL of 3 wt. % aqueous solution of $SnO_2$ nano-colloid | 0.01 mL of 3 mg/mL aqueous solution of $TiCl_4$ | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |
| Example 25 | 0.15 mL of 3 wt. % aqueous solution of $SnO_2$ nano-colloid | 0.01 mL of 3 mg/mL aqueous solution of $AlCl_3$ | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |

TABLE 2-continued

| | First sub-layer | | Second sub-layer | | Third sub-layer | | M solution for perovskite layer | | |
|---|---|---|---|---|---|---|---|---|---|
| | First host material | First doping material | Second host material | Second doping material | Third host material | Third doping material | Solute | Solvent | Hole transport layer |
| Example 26 | 0.15 mL of 3 wt. % aqueous solution of $SnO_2$ nano-colloid | 0.01 mL of 3 mg/mL aqueous solution of magnesium borate | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |
| Example 27 | 0.15 mL of 3 wt. % aqueous solution of $SnO_2$ nano-colloid | 0.01 mL of 3 mg/mL aqueous solution of LIF | 0.15 ml of 1.0 mol/L aqueous solution of perylene diimide | None | $SnO_2$ | 1.0 wt. % Te | $FA_{0.9}MA_{0.1}PbI_3$ | DMF | Solution of copper oxide in ethyl acetate |
| Example 28 | 0.15 mL of 3 wt. % aqueous solution of $SnO_2$ nano-colloid | 0.01 mL of 3 mg/mL aqueous solution of 1-butyl-3-methylimidazolium tetrafluoroborate | 0.15 ml of 1.0 mol/L aqueous solution of perylene diimide | None | $SnO_2$ | 1.0 wt. % F | $FA_{0.9}MA_{0.1}PbI_3$ | DMF | Solution of copper oxide in ethyl acetate |
| Example 29 | 0.15 mL of 3 wt. % aqueous solution of $SnO_2$ nano-colloid | 0.01 mL of 3 mg/mL aqueous solution of ethylenediamine-tetraacetic acid | 0.15 ml of 1.0 mol/L aqueous solution of perylene diimide | None | $SnO_2$ | 1.0 wt. % F | $FA_{0.9}MA_{0.1}PbI_3$ | DMF | Solution of copper oxide in ethyl acetate |
| Example 30 | 0.15 mL of 3 wt. % aqueous solution of $SnO_2$ nano-colloid | 0.01 mL of 3 mg/mL solution of carbon quantum dots in methanol | 0.15 ml of 1.0 mol/L aqueous solution of perylene diimide | None | $SnO_2$ | 1.0 wt. % F | $FA_{0.9}MA_{0.1}PbI_3$ | DMF | Solution of copper oxide in ethyl acetate |
| Example 31 | 0.15 mL of 3 wt. % aqueous solution of $SnO_2$ nano-colloid | 0.01 mL of 3 mg/mL aqueous solution of 4-pyridinecarb-oxylic acid | 0.15 ml of 1.0 mol/L aqueous solution of perylene diimide | None | $SnO_2$ | 1.0 wt. % F | $FA_{0.9}MA_{0.1}PbI_3$ | DMF | Solution of copper oxide in ethyl acetate |
| Example 32 | 0.15 mL of 3 wt. % aqueous solution of $SnO_2$ nano-colloid | 0.01 mL of 3 mg/mL solution of polystyrene in toluene | 0.15 ml of 1.0 mol/L aqueous solution of perylene diimide | None | $SnO_2$ | 1.0 wt. % F | $FA_{0.9}MA_{0.1}PbI_3$ | DMF | Solution of copper oxide in ethyl acetate |
| Example 33 | 0.15 mL of 3 wt. % aqueous solution of $SnO_2$ nano-colloid | 0.01 mL of 3 mg/mL aqueous solution of NaCl | 0.15 ml of 1.0 mol/L solution of benzoquinone in ethanol | None | $SnO_2$ | None | $FA_{0.9}MA_{0.1}PbI_3$ | DMF | Solution of copper oxide in ethyl acetate |
| Example 34 | 0.15 mL of 3 wt. % aqueous solution of $SnO_2$ nano-colloid | 0.01 mL of 3 mg/mL aqueous solution of NaCl | 0.15 ml of 1.0 mol/L solution of fullerene in methanol | None | $SnO_2$ | None | $FA_{0.9}MA_{0.1}PbI_3$ | DMF | Solution of copper oxide in ethyl acetate |
| Example 35 | 0.15 mL of 3 wt. % aqueous solution of $SnO_2$ nano-colloid | 0.01 mL of 3 mg/mL aqueous solution of NaCl | 0.15 ml of 1.0 mol/L dispersion of strontium titanate in ethanol | None | $SnO_2$ | None | $FA_{0.9}MA_{0.1}PbI_3$ | DMF | Solution of copper oxide in ethyl acetate |
| Example 36 | 0.15 mL of 3 wt. % aqueous solution of $SnO_2$ nano-colloid | 0.01 mL of 3 mg/mL aqueous solution of NaCl | 0.15 ml of 1.0 mol/L solution of lithium fluoride in dimethyl carbonate | None | $SnO_2$ | None | $FA_{0.9}MA_{0.1}PbI_3$ | DMF | Solution of copper oxide in ethyl acetate |
| Example 37 | 0.15 mL of 3 wt. % aqueous solution of $SnO_2$ nano-colloid | 0.01 mL of 3 mg/mL aqueous solution of NaCl | 0.15 ml of 1.0 mol/L dispersion of magnesium oxide in ethanol | None | $SnO_2$ | None | $FA_{0.9}MA_{0.1}PbI_3$ | DMF | Solution of copper oxide in ethyl acetate |

TABLE 2-continued

| | First sub-layer | | Second sub-layer | | Third sub-layer | | M solution for perovskite layer | | |
|---|---|---|---|---|---|---|---|---|---|
| | First host material | First doping material | Second host material | Second doping material | Third host material | Third doping material | Solute | Solvent | Hole transport layer |
| Example 38 | 0.15 mL of 3 wt. % aqueous solution of $SnO_2$ nano-colloid | 0.01 mL of 3 mg/mL aqueous solution of NaCl | 0.15 ml of 1.0 mol/L aqueous solution of phthalimide | None | $SnO_2$ | 1.0 wt. % W | $FA_{0.9}MA_{0.1}PbI_3$ | DMF | Solution of copper oxide in ethyl acetate |
| Example 39 | 0.15 mL of 3 wt. % aqueous solution of $SnO_2$ nano-colloid | 0.01 mL of 3 mg/mL aqueous solution of NaCl | 0.15 ml of 1.0 mol/L aqueous solution of phthalimide | None | $SnO_2$ | None | $FA_{0.9}MA_{0.1}PbI_3$ | DMF | Solution of copper oxide in ethyl acetate |
| Example 40 | 0.15 mL of 3 wt. % aqueous solution of $SnO_2$ nano-colloid | 0.01 mL of 3 mg/mL aqueous solution of NaCl | 0.15 ml of 1.0 mol/L aqueous solution of phthalimide | None | $SnO_2$ | 1.0 wt. % Ga | $FA_{0.9}MA_{0.1}PbI_3$ | DMF | Solution of copper oxide in ethyl acetate |

Comparative Examples 1-7

Preparation of FTO Conductive Glass Electrode

A set of FTO conductive glasses with a size of 2.0 cm×2.0 cm were used, with the surface thereof being washed twice with acetone and isopropanol sequentially, and were immersed in deionized water for an ultrasonic treatment for 10 min, then dried in a blast drying oven and placed in a glove box (under $N_2$ atmosphere).

Preparation of Electron Transport Layer Comprising a First Sub-Layer and a Second Sub-Layer Preparation of Second Sub-Layer The FTO conductive glass electrode was spin-coated with an F solution at a speed of 4000 rpm-6500 rpm and was heated at 100° C. for 10 min, with the thickness being 10-30 nm. The specific types of the F solution were as shown in Table 3.

Preparation of First Sub-Layer

The second sub-layer was spin-coated with a 3 wt. % aqueous solution of $SnO_2$ nano-colloid at a speed of 4000 rpm-6500 rpm and then was heated on a constant-temperature heating platform at 150° C. for 15 min, with the thickness being 30-60 nm.

Preparation of Perovskite Layer

The first sub-layer was spin-coated with a 1.5 mol/L M solution at a speed of 3000 rpm-4500 rpm, then transferred onto a constant-temperature heating platform, heated at 100° C. for 30 min and then cooled to room temperature, so as to form a perovskite layer with a thickness of 500 nm. The specific types of the M solution were as shown in Table 3.

Preparation of Hole Transport Layer

The perovskite layer was spin-coated with a 0.1 mol/L S solution at a speed of 4500 rpm-6000 rpm and was heated at 100° C. for 60 min, with the thickness being 30-60 nm. The specific types of the S solution were as shown in Table 3.

TABLE 3

| | Second sub-layer F solution | Perovskite layer M solution | Hole transport layer S solution |
|---|---|---|---|
| Comparative example 1 | 1.0 mol/L aqueous solution of perylene diimide | MAPbI3-DMF | Solution of H101 in ethyl acetate |
| Comparative example 2 | 1.0 mol/L aqueous solution of perylene diimide | MAPbI3-DMF | Solution of CzPAF-SBF in ethyl acetate |
| Comparative example 3 | 1.0 mol/L aqueous solution of perylene diimide | MAPbI3-DMF | Solution of H101 in ethyl acetate |
| Comparative example 4 | 1.0 mol/L aqueous solution of perylene diimide | MAPbI3-DMF | Solution of Z1011 in ethyl acetate |
| Comparative example 5 | 2 wt. % aqueous solution of $ZnO_2$ nano-colloid | Calcium titanate-DMF | Solution of copper oxide in ethyl acetate |
| Comparative example 6 | 2 wt. % aqueous solution of $ZnO_2$ nano-colloid | Strontium titanate-DMF | Solution of copper oxide in ethyl acetate |
| Comparative example 7 | 2 wt. % aqueous solution of $ZnO_2$ nano-colloid | $MAPbBr_3$-DMF | Solution of copper oxide in ethyl acetate |

In Table 3, H101 represents triphenylamine with a triptycene core, CzPAF-SBF represents N-(4-phenylamine)carbazole-spirobifluorene, Z101 represents 4-((E)-4-(bis(4-((E)-4-(dibutylamino)styryl)phenyl)amino)styryl)-N-(4-((E)((E)-4-(dibutylamino)styryl)phenyl)amino)styryl)phenyl)-N-phenylaniline.

Preparation of Ag Electrode

The above-mentioned sample was put into a vacuum coating machine, and an Ag electrode was evaporated onto the surface of the resulting hole transport layer under a vacuum condition of $5\times10^{-4}$ Pa, with the thickness of the Ag electrode being 80 nm.

Methods for Testing Performance of Perovskite Solar Cell

1. Method for Testing Energy Band Distribution

The energy band distribution of the resulting sub-layers of the electron transport layer, the hole transport layer, and the perovskite absorption layer was measured using ultraviolet photoelectron spectrometer (UPS) and X-ray photoelectron spectrometer (XPS). The test was performed at a normal temperature and pressure in an atmospheric environment, and a He—I lamp (21.2 eV) was used as the laser source. As an example, the UPS and XPS model was Escalab 250Xi (Thermo Scientific).

2. Method for Testing Power Conversion Efficiency

The energy conversion efficiency was obtained by a voltage-current characteristic test, and the test was performed at a normal temperature and pressure in an atmospheric environment, with a simulated solar light source having an intensity as standard AM1.5G. As an example, the test equipment model was IVS-KA5000 from EnliTech.

Results of Performance Test of Perovskite Solar Cell

It should be noted that in the following description, CBM represents the conduction band bottom energy level, VBM represents the valence band top energy level, and FLP represents the Fermi-level pinning, and specifically, CBM1 represents the conduction band bottom energy level of the first sub-layer, CBM2 represents the conduction band bottom energy level of the second sub-layer, CBM3 represents the conduction band bottom energy level of the third sub-layer, CBM4 represents the conduction band bottom energy level of the hole transport layer, and CBM5 represents the conduction band bottom energy level of the perovskite layer.

1. The results of performance test of examples 1 to 8 and comparative examples 1 to 4 were as shown in Table 4.

TABLE 4

| | Electron transport layer | | | | | | | | | | Power conversion efficiency |
|---|---|---|---|---|---|---|---|---|---|---|---|
| | First sub-layer/ev | | Second sub-layer/ev | | Hole transport layer/ev | | Difference between energy levels | | | | |
| | CBM1 | VBM1 | CBM2 | VBM2 | CBM4 | VBM4 | CBM1 − CBM4 | CBM2 − CBM4 | VBM1 − VBM4 | VBM2 − VBM4 | Eff (%) |
| Example 1 | −4.6 | −7.9 | −4.7 | −6.6 | −4.1 | −5.4 | −0.5 | −0.6 | −2.5 | −1.2 | 15.5 |
| Example 2 | −4.3 | −7.6 | −4.7 | −6.6 | −4.1 | −5.4 | −0.2 | −0.6 | −2.2 | −1.2 | 15.5 |
| Example 3 | −4.5 | −5.9 | −4.7 | −6.6 | −4.1 | −5.4 | −0.4 | −0.6 | −0.5 | −1.2 | 15.2 |
| Example 4 | −4.5 | −5.6 | −4.7 | −6.6 | −4.1 | −5.4 | −0.4 | −0.6 | −0.2 | −1.2 | 15.6 |
| Example 5 | −4.5 | −7.8 | −4.5 | −6.7 | −4.0 | −5.4 | −0.5 | −0.85 | −2.4 | −1.3 | 14.8 |
| Example 6 | −4.5 | −7.8 | −4.6 | −6.7 | −4.0 | −5.4 | −0.5 | −0.6 | −2.4 | −1.3 | 15.2 |
| Example 7 | −4.5 | −7.8 | −4.5 | −5.9 | −4.0 | −5.4 | −0.5 | −0.5 | −2.4 | −0.5 | 15.0 |
| Example 8 | −4.5 | −7.8 | −4.5 | −6.0 | −4.0 | −5.4 | −0.5 | −0.5 | −2.4 | −0.6 | 14.9 |
| Comparative example 1 | −4.5 | −7.8 | −4.7 | −6.6 | −4.1 | −6.8 | −0.4 | −0.6 | −1.0 | 0.2 | 4.2 |
| Comparative example 2 | −4.5 | −7.8 | −4.7 | −6.6 | −4.2 | −7.1 | −0.3 | −0.5 | −0.7 | 0.5 | 4.8 |
| Comparative example 3 | −4.5 | −7.8 | −4.7 | −6.6 | −4.1 | −7.4 | −0.4 | −0.6 | −0.4 | 0.8 | 3.2 |
| Comparative example 4 | −4.5 | −7.8 | −4.7 | −6.6 | −4.7 | −6.2 | 0.2 | 0 | −1.6 | −0.4 | 3.9 |

As can be seen from Table 4, for the perovskite solar cells in examples 1 to 8, when compared to comparative examples 1 to 4, the conduction band bottom energy level of each sub-layer was lower than that of the hole transport layer and the first sub-layer had a higher electron transport efficiency, and the valence band top energy levels of each sub-layer was lower than that of the hole transport layer and the electron transport layer had a higher electron transport efficiency, which was conducive to improving the power conversion efficiency of the perovskite solar cells.

2. The results of performance test of examples 9 to 14 and comparative examples 5 to 7 were as shown in Tables 5 and 6.

TABLE 5

| | Electron transport layer | | | | | | | | | |
|---|---|---|---|---|---|---|---|---|---|---|
| | First sub-layer/ev | | Second sub-layer/ev | | Hole transport layer/ev | | Difference between energy levels | | | |
| | CBM1 | VBM1 | CBM2 | VBM2 | CBM4 | VBM4 | CBM1 − CBM4 | CBM2 − CBM4 | VBM1 − VBM4 | VBM2 − VBM4 |
| Example 9 | −4.6 | −7.9 | −4.7 | −6.6 | −4.1 | −5.4 | −0.5 | −0.6 | −2.5 | −1.2 |
| Example 10 | −4.6 | −7.9 | −4.7 | −6.6 | −4.1 | −5.4 | −0.5 | −0.6 | −2.5 | −1.2 |
| Example 11 | −4.5 | −6.6 | −4.7 | −6.6 | −4.1 | −5.4 | −0.4 | −0.6 | −1.2 | −1.2 |

TABLE 5-continued

| | Electron transport layer | | | | | | | | | |
|---|---|---|---|---|---|---|---|---|---|---|
| | First sub-layer/ev | | Second sub-layer/ev | | Hole transport layer/ev | | Difference between energy levels | | | |
| | CBM1 | VBM1 | CBM2 | VBM2 | CBM4 | VBM4 | CBM1 − CBM4 | CBM2 − CBM4 | VBM1 − VBM4 | VBM2 − VBM4 |
| Example 12 | −4.3 | −6.5 | −4.7 | −6.6 | −4.1 | −5.4 | −0.2 | −0.6 | −1.1 | −1.2 |
| Example 13 | −4.2 | −6.5 | −4.7 | −6.6 | −4.1 | −5.4 | −0.1 | −0.6 | −1.1 | −1.2 |
| Example 14 | −4.7 | −7.9 | −4.7 | −6.6 | −4.1 | −5.4 | −0.6 | −0.6 | −2.5 | −1.2 |
| Comparative example 5 | −4.5 | −7.8 | −4.4 | −7.9 | −4.1 | −5.4 | −0.4 | −0.3 | −2.4 | −2.5 |
| Comparative example 6 | −4.5 | −7.8 | −4.4 | −7.9 | −4.1 | −5.4 | −0.4 | −0.3 | −2.4 | −2.5 |
| Comparative example 7 | −4.5 | −7.8 | −4.4 | −7.9 | −4.1 | −5.4 | −0.4 | −0.3 | −2.4 | −2.5 |

TABLE 6

| | First sub-layer/ev | | Perovskite layer/ev | | Difference between energy levels/ev | | Power conversion efficiency |
|---|---|---|---|---|---|---|---|
| | CBM1 | VBM1 | CBM5 | VBM5 | CBM1 − CBM5 | VBM1 − VBM5 | Eff (%) |
| Example 9 | −4.6 | −7.9 | −3.6 | −5.4 | −1.0 | −2.5 | 18.5 |
| Example 10 | −4.6 | −7.9 | −4.3 | −5.7 | −0.3 | −2.2 | 20.4 |
| Example 11 | −4.5 | −6.6 | −4.5 | −5.4 | 0.0 | −1.2 | 20.5 |
| Example 12 | −4.3 | −6.5 | −4.6 | −5.9 | 0.3 | −0.6 | 19.8 |
| Example 13 | −4.2 | −6.5 | −5.2 | −6.0 | 1.0 | −0.5 | 16.9 |
| Example 14 | −3.2 | −6.5 | −4.2 | −5.6 | 1.0 | −0.9 | 16.9 |
| Comparative example 5 | −4.5 | −7.8 | −6.0 | −7.8 | 1.5 | 0.0 | 5.0 |
| Comparative example 6 | −4.5 | −7.8 | −6.6 | −8.3 | 2.1 | 0.5 | 3.0 |
| Comparative example 7 | −4.5 | −7.8 | −3.0 | −5.2 | −1.5 | −2.6 | 8.0 |

As can be seen from Tables 5 and 6, for the perovskite solar cells in examples 9 to 14, when compared to comparative examples 5 to 7, the difference between the conduction band bottom energy levels of the first sub-layer and the perovskite layer was −1.0 eV-1.0 eV, and particularly when the difference between the conduction band bottom energy levels of the first sub-layer and the perovskite layer was-0.3 eV-0.3 eV, the first sub-layer had a higher electron transport efficiency, which was conducive to improving the power conversion efficiency of the perovskite solar cells.

For the perovskite solar cells in examples 9 to 14, when compared to comparative examples 5 and 6, the valence band top energy level of the first sub-layer was lower than that of the perovskite layer, and the electron transport efficiency of the first sub-layer could be further improved, which was conducive to further improving the power conversion efficiency of the perovskite solar cells.

3. The results of performance test of examples 11 and 13 to 21 were as shown in Tables 7 and 8.

TABLE 7

| | Electron transport layer | | | | | | Difference between energy levels | | | |
|---|---|---|---|---|---|---|---|---|---|---|
| | First sub-layer/ev | | Second sub-layer/ev | | Hole transport layer/ev | | CBM1 − | CBM2 − | VBM1 − | VBM2 − |
| | CBM1 | VBM1 | CBM2 | VBM2 | CBM4 | VBM4 | CBM4 | CBM4 | VBM4 | VBM4 |
| Example 15 | −4.2 | −6.2 | −4.7 | −6.6 | −4.1 | −5.4 | −0.1 | −0.6 | −0.8 | −1.2 |
| Example 16 | −4.2 | −6.5 | −4.7 | −6.6 | −4.1 | −5.4 | −0.1 | −0.6 | −1.1 | −1.2 |
| Example 17 | −4.5 | −6.0 | −4.7 | −6.6 | −4.1 | −5.4 | −0.4 | −0.6 | −0.6 | −1.2 |
| Example 18 | −4.2 | −6.2 | −4.7 | −6.6 | −4.1 | −5.4 | −0.1 | −0.6 | −0.8 | −1.2 |
| Example 19 | −4.2 | −6.2 | −4.7 | −6.6 | −4.1 | −5.4 | −0.1 | −0.6 | −0.8 | −1.2 |
| Example 20 | −4.2 | −7.2 | −4.7 | −6.6 | −4.1 | −5.4 | −0.1 | −0.6 | −1.8 | −1.2 |
| Example 21 | −4.5 | −6.0 | −4.7 | −6.6 | −4.1 | −5.4 | −0.4 | −0.6 | −1.6 | −1.2 |

TABLE 8

| | First sub-layer/ev | | | Perovskite layer/ev | Difference between energy levels/ev | | | Power conversion efficiency |
|---|---|---|---|---|---|---|---|---|
| | FLP1 | CBM1 | VBM1 | FLP5 | FLP1 − FLP5 | CBM1 − FLP1 | CBM1 − VBM1 | Eff (%) |
| Example 11 | −4.6 | −4.5 | −6.6 | −5.1 | 0.5 | 0.1 | 2.1 | 20.5 |
| Example 13 | −4.3 | −4.2 | −6.5 | −5.3 | 1.0 | 0.1 | 2.3 | 16.9 |
| Example 14 | −4.7 | −4.6 | −7.9 | −4.2 | −0.5 | 0.1 | 3.3 | 16.9 |
| Example 15 | −4.7 | −3.2 | −5.2 | −5.0 | 0.3 | 1.5 | 2.0 | 16.0 |
| Example 16 | −3.7 | −3.2 | −6.5 | −5.0 | 1.3 | 0.5 | 3.3 | 19.7 |
| Example 17 | −4.7 | −4.5 | −6.0 | −5.0 | 0.3 | 0.2 | 1.5 | 18.5 |
| Example 18 | −4.7 | −3.2 | −5.2 | −5.0 | 0.3 | 1.5 | 2.0 | 16.5 |
| Example 19 | −3.0 | −2.9 | −5.0 | −5.0 | 2.0 | 0.1 | 2.1 | 14.0 |
| Example 20 | −5.2 | −3.2 | −7.2 | −5.0 | −0.2 | 2.0 | 4.0 | 14.5 |
| Example 21 | −4.6 | −4.5 | −5.5 | −5.0 | 0.4 | 0.1 | 1.0 | 14.8 |

As can be seen from Tables 7 and 8, for the perovskite solar cells in examples 11 and 13 to 18, when compared to example 19, the difference between the Fermi levels of the first sub-layer and the perovskite layer FLP1−FLP5≤1.5 eV, and the first sub-layer had a higher electron transport efficiency, which was conducive to improving the power conversion efficiency of the perovskite solar cells.

For the perovskite solar cells in examples 11 and 13 to 18, when compared to example 20, the difference between the conduction band bottom energy level and the Fermi level of the first sub-layer CBM1−FLP1≤1.5 eV, which showed a higher power conversion efficiency.

For the perovskite solar cells in examples 13 to 18, when compared to example 21, the difference between the conduction band bottom energy level and the valence band top energy level of the first sub-layer CBM−VBM≥1.5 eV, which showed a higher power conversion efficiency.

4. The results of performance test of examples 22 to 40 were as shown in Table 9.

TABLE 9

| | Electron transport layer | | | | | | Hole transport layer/ev | |
|---|---|---|---|---|---|---|---|---|
| | First sub-layer/ev | | Second sub-layer/ev | | Third sub-layer/ev | | | |
| | CBM1 | VBM1 | CBM2 | VBM2 | CBM3 | VBM3 | CBM4 | VBM4 |
| Example 22 | −4.5 | −5.9 | −4.6 | −6.8 | −4.7 | −7.2 | −4.1 | −5.4 |
| Example 23 | −4.4 | −6.2 | −4.6 | −6.8 | −4.7 | −7.2 | −4.1 | −5.4 |
| Example 24 | −4.3 | −6.2 | −4.6 | −6.8 | −4.7 | −7.2 | −4.1 | −5.4 |
| Example 25 | −4.3 | −6.4 | −4.6 | −6.8 | −4.7 | −7.2 | −4.1 | −5.4 |
| Example 26 | −4.4 | −6.3 | −4.6 | −6.8 | −4.7 | −7.2 | −4.1 | −5.4 |
| Example 27 | −4.5 | −6.6 | −4.6 | −6.8 | −4.7 | −7.2 | −4.1 | −5.4 |
| Example 28 | −4.6 | −7.2 | −4.6 | −6.8 | −4.5 | −6.6 | −4.1 | −5.4 |
| Example 29 | −4.8 | −6.9 | −4.6 | −6.8 | −4.5 | −6.6 | −4.1 | −5.4 |
| Example 30 | −4.7 | −7.0 | −4.6 | −6.8 | −4.5 | −6.6 | −4.1 | −5.4 |
| Example 31 | −4.8 | −7.0 | −4.6 | −6.8 | −4.5 | −6.6 | −4.1 | −5.4 |
| Example 32 | −4.5 | −6.8 | −4.6 | −6.8 | −4.5 | −6.6 | −4.1 | −5.4 |
| Example 33 | −4.5 | −5.9 | −4.7 | −6.5 | −4.5 | −7.8 | −4.1 | −5.4 |
| Example 34 | −4.5 | −5.9 | −4.7 | −7.0 | −4.5 | −7.8 | −4.1 | −5.4 |
| Example 35 | −4.5 | −5.9 | −4.2 | −6.5 | −4.5 | −7.8 | −4.1 | −5.4 |
| Example 36 | −4.5 | −5.9 | −4.3 | −6.0 | −4.5 | −7.8 | −4.1 | −5.4 |
| Example 37 | −4.5 | −5.9 | −4.5 | −7.5 | −4.5 | −7.8 | −4.1 | −5.4 |
| Example 38 | −4.5 | −5.9 | −4.6 | −6.8 | −4.8 | −7.3 | −4.1 | −5.4 |
| Example 39 | −4.5 | −5.9 | −4.6 | −6.8 | −4.5 | −6.6 | −4.1 | −5.4 |
| Example 40 | −4.5 | −5.9 | −4.6 | −6.8 | −4.7 | −7.0 | −4.1 | −5.4 |

| | Difference between energy levels | | | | | | Power conversion efficiency |
|---|---|---|---|---|---|---|---|
| | CBM1 − CBM4 | CBM2 − CBM4 | CBM3 − CBM4 | VBM1 − VBM4 | VBM2 − VBM4 | VBM3 − VBM4 | Eff (%) |
| Example 22 | −0.4 | −0.5 | −0.6 | −0.5 | −1.4 | −2.8 | 21.9 |
| Example 23 | −0.3 | −0.5 | −0.6 | −0.8 | −1.4 | −2.8 | 21.3 |
| Example 24 | −0.2 | −0.5 | −0.6 | −0.8 | −1.4 | −2.8 | 20.9 |
| Example 25 | −0.2 | −0.5 | −0.6 | −1.0 | −1.4 | −2.8 | 21.3 |
| Example 26 | −0.3 | −0.5 | −0.6 | −0.9 | −1.4 | −2.8 | 20.2 |
| Example 27 | −0.4 | −0.5 | −0.6 | −1.2 | −1.4 | −2.8 | 21.2 |
| Example 28 | −0.5 | −0.5 | −0.4 | −1.8 | −1.4 | −1.2 | 20.5 |
| Example 29 | −0.7 | −0.5 | −0.4 | −1.5 | −1.4 | −1.2 | 20.5 |
| Example 30 | −0.6 | −0.5 | −0.4 | −2.6 | −1.4 | −1.2 | 20.8 |
| Example 31 | −0.7 | −0.5 | −0.4 | −2.6 | −1.4 | −1.2 | 20.3 |
| Example 32 | −0.4 | −0.5 | −0.4 | −1.4 | −1.4 | −1.2 | 20.9 |

TABLE 9-continued

| | | | | | | | |
|---|---|---|---|---|---|---|---|
| Example 33 | −0.4 | −0.6 | −0.4 | −0.5 | −1.1 | −2.4 | 20.2 |
| Example 34 | −0.4 | −0.6 | −0.4 | −0.5 | −2.6 | −2.4 | 20.1 |
| Example 35 | −0.4 | −0.1 | −0.4 | −0.5 | −1.1 | −2.4 | 20.0 |
| Example 36 | −0.4 | −0.2 | −0.4 | −0.5 | −0.6 | −2.4 | 20.3 |
| Example 37 | −0.4 | −0.4 | −0.4 | −0.5 | −2.1 | −2.4 | 20.2 |
| Example 38 | −0.4 | −0.5 | −0.7 | −0.5 | −1.4 | −1.9 | 21.5 |
| Example 39 | −0.4 | −0.5 | −0.4 | −0.5 | −1.4 | −1.2 | 21.4 |
| Example 40 | −0.4 | −0.5 | −0.6 | −0.5 | −1.4 | −2.6 | 21.6 |

As can be seen from Table 9, when compared to example 1, the electron transport layer of the perovskite solar cells in examples 22 to 40 had three sub-layers, which was conducive to improving the power conversion efficiency of the perovskite solar cells.

While the present application has been described with reference to some embodiments, various modifications may be made thereto and equivalents may be substituted for components thereof without departing from the scope of the present application, in particular, as long as there are no structural conflicts, the technical features mentioned in embodiments can be combined in any manner. The present application is not limited to the specific embodiments disclosed herein but includes all the technical solutions that fall within the scope of the claims.

What is claimed is:

1. A perovskite solar cell, comprising:

a perovskite layer comprising a first surface and a second surface that are opposite each other in the thickness direction thereof, a hole transport layer provided on the first surface; and an electron transport layer provided on the second surface, wherein the electron transport layer comprises a doping material and at least two sub-layers having a conduction band bottom energy level lower than that of the hole transport layer and a valence band top energy level lower than that of the hole transport layer;

wherein:

the electron transport layer comprises a first sub-layer and a second sub-layer that are stacked sequentially in a direction away from the second surface;

the first sub-layer is a tin oxide layer comprising a first doping material, the first doping material comprises at least one of an alkali metal, an alkaline earth metal, a transition metal, a poor metal, a metalloid, a non-metallic element, an ionic liquid, a carboxylic acid, a phosphoric acid, a carbon derivative, a self-assembled single molecule, or an organic polymer; and the second sub-layer comprises at least one of an imide compound layer, a quinone compound layer, or a perovskite oxide layer.

2. The perovskite solar cell according to claim 1, wherein: the difference between the conduction band bottom energy levels of the sub-layer of the electron transport layer that is close to the second surface and the perovskite layer is −1.0 eV-1.0 eV, and optionally, the difference between the conduction band bottom energy levels of the sub-layer and the perovskite layer is −0.3 eV-0.3 eV.

3. The perovskite solar cell according to claim 1, wherein: the valence band top energy level of the sub-layer of the electron transport layer that is close to the second surface is lower than that of the perovskite layer.

4. The perovskite solar cell according to claim 1, wherein: the difference between Fermi levels of the sub-layer of the electron transport layer that is close to the second surface and the perovskite layer is ≤1.5 eV.

5. The perovskite solar cell according to claim 1, wherein: the difference between the conduction band bottom energy level and a Fermi level of the sub-layer of the electron transport layer that is close to the second surface is ≤1.5 eV.

6. The perovskite solar cell according to claim 1, wherein: the difference between the conduction band bottom energy level and the valence band top energy level of the sub-layer of the electron transport layer that is close to the second surface is ≥1.5 eV.

7. The perovskite solar cell according to claim 1, wherein the electron transport layer further comprises a third sub-layer arranged on a surface of the second sub-layer that is away from the first sub-layer.

8. The perovskite solar cell according to claim 7, wherein the third sub-layer comprises a metal oxide layer or a metal oxide layer comprising a second doping material, and the metal oxide layer includes a $SnO_2$ layer, a $In_2O_3$ layer, a ZnO layer, a CdO layer, a NiO layer, a $CdIn_2O_4$ layer, a $Cd_2SnO_4$ layer, a $Zn_2SnO_4$ layer, a $MgIn_2O_4$ layer, a $ZnIn_2O_4$ layer, a $CoIn_3O_6$ layer, a $ZnV_2O_6$ layer, a $CuAlO_2$ layer, or a $CuGaO_2$ layer.

9. The perovskite solar cell according to claim 8, wherein:

the $SnO_2$ layer comprises a second doping material, the element of which comprises at least one of F, Sb, P, As, Te and Cl;

the $In_2O_3$ layer comprises a second doping material, the element of which comprises at least one of W, Mn, Zr, Ti, Sb, F and Ag; and the ZnO layer comprises a second doping material, the element of which comprises at least one of Ga, In, F, N, B and Al.

10. The perovskite solar cell according to claim 1, wherein:

the alkali metal includes at least one of Li, K, Na, Rb and Cs;

the alkaline earth metal includes at least one of Be, Sr and Ba;

the transition metal includes at least one of Ti, Cr, Mn, Fe, Co, Ni, Cu, Zn, Zr, Nb, Mo, Ru, Rh, Pd, Ag, Cd, Ta, Pt and Au;

the poor metal includes at least one of Al, Ga, In, Sn, Tl, Pb and Bi;

the metalloid includes at least one of B, Si, Ge, As, Sb and Te;

the non-metallic element includes at least one of F, Cl, Br, I, P, S and Se;

the ionic liquid includes at least one of 1-butyl-3-methylimidazolium tetrafluoroborate, ammonium chloride, ammonium sulfide, tetramethylammonium hydroxide and 2,2,2-trifluoroethanol;

the carboxylic acid includes at least one of ethylenediaminetetraacetic acid, diethylenetriaminepentaacetic acid, 4-imidazoleacetic acid hydrochloride, and acetic acid;

the carbon derivative includes at least one of carbon quantum dots, carbon nanotubes, graphene, carbon 60, carbon 60 derivatives, graphitic carbon nitride and carbon 9;

the self-assembled single molecule includes at least one of 4-pyridinecarboxylic acid, dopamine, 3-aminopropyltriethoxysilane and glycine; and the organic polymer includes at least one of polystyrene, polyethylenimine ethoxylated, polyethylene oxide, and triphenylphosphine oxide.

11. The perovskite solar cell according to claim 1, wherein:

the imide compound layer comprises an imide compound or a derivative of the imide compound, and the imide compound includes phthalamide, succinimide, N-bromosuccinimide, glutarimide or maleimide;

the quinone compound layer comprises a quinone compound or a derivative of the quinone compound, and the quinone compound includes benzoquinone, naphthoquinone, phenanthrenequinone or anthraquinone; and the perovskite oxide layer comprises strontium titanate, calcium titanate, barium titanate, lithium titanate, iron (II) titanium oxide, nickel titanate or cobalt titanate.

12. A photovoltaic module comprising the perovskite solar cell according to claim 1.

13. The perovskite solar cell according to claim 1, wherein the conduction band bottom energy level of the sub-layer of the electron transport layer that is closest to the second surface is higher than or equal to a conduction band bottom energy level of the perovskite layer, and a difference between the conduction band bottom energy levels of the sub-layer of the electron transport layer that is closest to the second surface and the perovskite layer is 0 eV-1.0 eV.

14. The perovskite solar cell according to claim 1, wherein the conduction band bottom energy level is higher than a Fermi level of the sub-layer of the electron transport layer that is closest to the second surface, and a difference between the conduction band bottom energy level and the Fermi level of the sub-layer of the electron transport layer that is closest to the second surface is 0.5 eV-1.5 eV.

15. A perovskite solar cell, comprising:

a perovskite layer comprising a first surface and a second surface that are opposite each other in the thickness direction thereof;

a hole transport layer provided on the first surface; and an electron transport layer provided on the second surface, wherein the electron transport layer comprises a doping material and at least two sub-layers having a conduction band bottom energy level lower than that of the hole transport layer and a valence band top energy level lower than that of the hole transport layer;

wherein the conduction band bottom energy level of the sub-layer of the electron transport layer that is closest to the second surface is higher than or equal to a conduction band bottom energy level of the perovskite layer, and a difference between the conduction band bottom energy levels of the sub-layer of the electron transport layer that is closest to the second surface and the perovskite layer is 0 eV-1.0 eV.

* * * * *